(12) United States Patent
Saido

(10) Patent No.: US 11,219,096 B2
(45) Date of Patent: Jan. 4, 2022

(54) SUBSTRATE PROCESSING APPARATUS AND FURNACE OPENING ASSEMBLY THEREOF

(71) Applicant: Kokusai Electric Corporation, Tokyo (JP)

(72) Inventor: Shuhei Saido, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 88 days.

(21) Appl. No.: 16/703,623

(22) Filed: Dec. 4, 2019

(65) Prior Publication Data

US 2020/0187305 A1    Jun. 11, 2020

(30) Foreign Application Priority Data

Dec. 5, 2018   (JP) .............................. JP2018-228261

(51) Int. Cl.
*H05B 3/68* (2006.01)
*H05B 1/02* (2006.01)
(Continued)

(52) U.S. Cl.
CPC ....... *H05B 1/0233* (2013.01); *C23C 16/4412* (2013.01); *C23C 16/481* (2013.01); *H01L 21/67248* (2013.01)

(58) Field of Classification Search
CPC ............ C23C 16/4408; C23C 16/4412; C23C 16/45523; C23C 16/45557;
(Continued)

(56) References Cited

U.S. PATENT DOCUMENTS 4,524,719 A * 6/1985 Campbell ............. C23C 16/481
118/719
5,578,132 A * 11/1996 Yamaga .............. C23C 16/4404
118/715
(Continued)

FOREIGN PATENT DOCUMENTS

JP     1990218117 A    8/1990
JP     04-280418 A    10/1992
(Continued)

OTHER PUBLICATIONS

Office Action in corresponding Japanese Patent Application No. 2018-228261, dated Feb. 9, 2021, with English translation.

*Primary Examiner* — Sang Y Paik
(74) *Attorney, Agent, or Firm* — Edell, Shapiro & Finnan, LLC

(57) ABSTRACT

Described herein is a technique capable of suppressing adhesion of by-products to a furnace opening portion. A substrate processing apparatus includes: a reaction vessel having an opening at a lower end and accommodating a substrate retainer; a shaft rotatably supporting the substrate retainer; a cap including: a side surface portion having a predetermined gap with an inner surface of the reaction vessel; a cylindrical portion through which the shaft is inserted; an upper plate portion of an annular shape; and a flange connected to a lower end of the side surface portion; and a cap cover connected to the shaft above the upper end of the cylindrical portion. A purge gas from thereunder flows sequentially to a space between the shaft and the cylindrical portion, a space between the upper plate portion and the cap cover and a space between the side surface portion and the cap cover.

11 Claims, 5 Drawing Sheets

(51) Int. Cl.
*C23C 16/48* (2006.01)
*C23C 16/44* (2006.01)
*H01L 21/67* (2006.01)

(58) Field of Classification Search
CPC . C23C 16/4584; C23C 16/4586; C23C 16/46; C23C 16/481; H01L 21/67109; H01L 21/67248; H01L 21/67757; H01L 21/68792; H05B 1/0233
USPC .............................. 219/444.1; 392/416–425
See application file for complete search history.

(56) References Cited

U.S. PATENT DOCUMENTS

| | | |
|---|---|---|
| 6,444,940 B1 | 9/2002 | Saito et al. |
| 2001/0009178 A1* | 7/2001 | Tamura ............... H01L 21/6833 |
| | | 156/345.53 |
| 2003/0015138 A1 | 1/2003 | Tometsuka |
| 2014/0106573 A1 | 4/2014 | Terasaki et al. |
| 2017/0330787 A1* | 11/2017 | Mitsunaga ........ H01L 21/67109 |
| 2017/0335458 A1* | 11/2017 | Murata ................. C23C 16/345 |

FOREIGN PATENT DOCUMENTS

| | | |
|---|---|---|
| JP | 3131208 B | 1/2001 |
| JP | 2001156005 A | 6/2001 |
| JP | 2003-031564 A | 1/2003 |
| JP | 2013-107808 A | 6/2013 |
| JP | 2014075579 A | 4/2014 |
| JP | 2018-049853 A | 3/2018 |
| WO | 2018150537 A1 | 8/2018 |

* cited by examiner

SUBSTRATE PROCESSING APPARATUS AND FURNACE OPENING ASSEMBLY THEREOF

CROSS REFERENCE TO RELATED APPLICATIONS

This application claims foreign priority under 35 U.S.C. § 119(a)-(d) to Application No. JP 2018-228261 filed on Dec. 5, 2018, the entire contents of which are hereby incorporated by reference.

TECHNICAL FIELD

The present disclosure relates to a substrate processing apparatus configured to perform a process such as a film-forming process on a substrate and a furnace opening assembly of the substrate processing apparatus.

BACKGROUND

In a heat treatment process of a substrate, which is one of manufacturing processes of a semiconductor device, a substrate processing apparatus such as a vertical type substrate processing apparatus capable of batch processing a plurality of substrates may be used. For example, in the vertical type substrate processing apparatus, in order to perform a process such as the heat treatment process, a predetermined number of substrates are charged (transferred) into a substrate retainer of the vertical the substrate processing apparatus and supported in a vertical direction by the substrate retainer. After the substrate retainer is loaded (transferred) into a process chamber of the vertical type substrate processing apparatus, by introducing (supplying) a process gas into the process chamber while the substrates are heated by a heater installed at an outer periphery of the process chamber, a substrate processing such as the heat treatment process is performed.

In the vertical type substrate processing apparatus according to related arts, a heat insulating material and a heater are provided around an R shaft (also referred to as a "rotating shaft") of the vertical type substrate processing apparatus. The R shaft is configured to rotatably hold (support) the substrate retainer in a heat insulating region provided at a lower portion of the process chamber. The R shaft is provided through a lid (also referred to as a "cap") of the process chamber while a space between the R shaft and the lid (cap) is maintained to be airtight by a sealing part such as a magnetic fluid seal. In order to protect the R shaft from a reactive gas used in the process chamber, a purge gas such as nitrogen gas may be supplied in the vicinity of the magnetic fluid seal.

According to the vertical type substrate processing apparatus described above, the purge gas for protecting the magnetic fluid seal may flow upward along the R shaft and be supplied (discharged) from the immediate vicinity of a substrate. Therefore, the film-forming uniformity on a surface of the substrate may deteriorate in a lower portion of a substrate accommodating region of the process chamber. As a result, the productivity of the substrate professing may be reduced.

SUMMARY

Described herein is a technique capable of suppressing adhesion of by-products to a furnace opening portion of a substrate processing apparatus without affecting the film-forming uniformity on a surface of the substrate.

According to one aspect of the technique of the present disclosure, there is provided a substrate processing apparatus including: a reaction vessel provided with an opening at a lower end thereof and accommodating a substrate retainer configured to support a substrate; a shaft configured to rotatably support the substrate retainer; a cap including: a side surface portion provided so as to maintain a predetermined gap with an inner surface of the reaction vessel when the cap is inserted into the reaction vessel; a cylindrical portion through which the shaft is inserted at a center portion of the side surface portion; an upper plate portion of an annular shape connecting an upper end of the side surface portion to an upper end of the cylindrical portion; and a flange connected to a lower end of the side surface portion, wherein the cap is configured to hermetically close the reaction vessel by bringing the flange into direct or indirect contact with the opening; and a cap cover connected to the shaft above the upper end of the cylindrical portion and configured to cover an upper surface and a side surface of the cap, wherein a purge gas supplied to vicinity of the shaft from thereunder flows sequentially to a space between the shaft and the cylindrical portion, a space between the upper plate portion and the cap cover and a space between the side surface portion and the cap cover.

DETAILED DESCRIPTION

Embodiments

Figure 1:
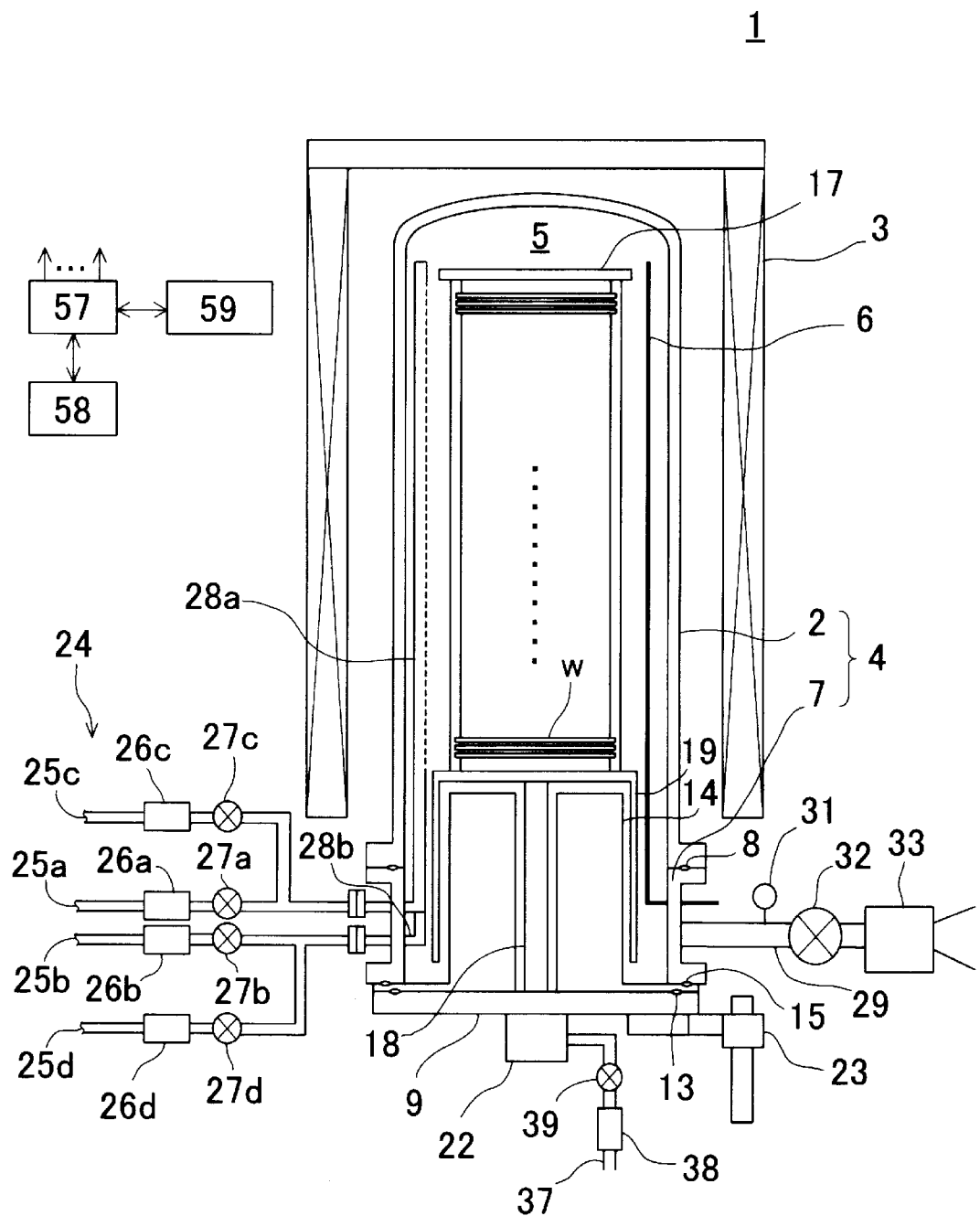
FIG. 1 schematically illustrates a vertical cross-section of a process furnace of a substrate processing apparatus according to one or more embodiments described herein.

Hereinafter, one or more embodiments (hereinafter, simply referred to as "embodiments") according to the technique of the present disclosure will be described with reference to the drawings. Like reference numerals represent like components in the drawings, and redundant descriptions related thereto will be omitted.

Figure 2:
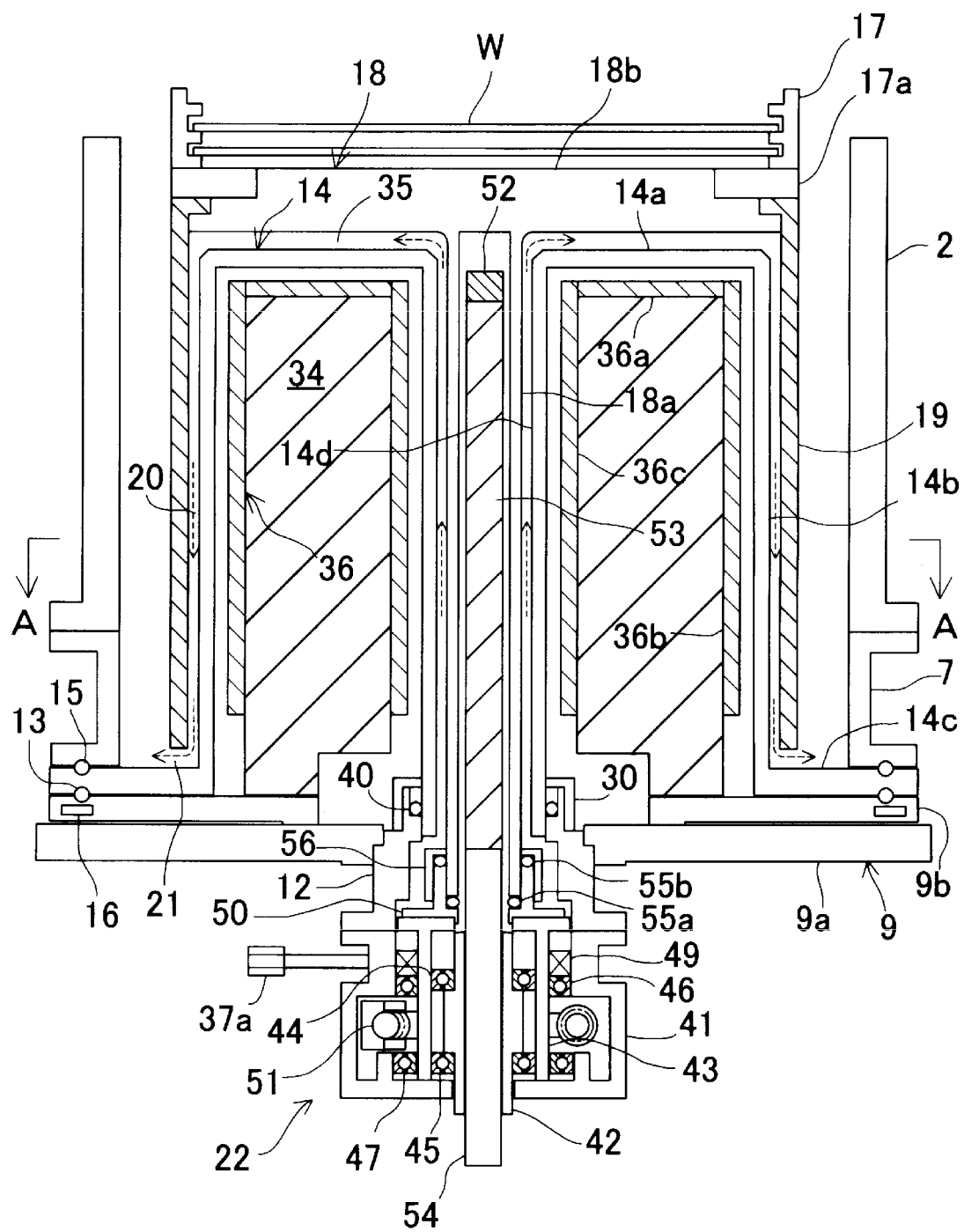
FIG. 2 is an enlarged view schematically illustrating a furnace opening portion of the process furnace of the substrate processing apparatus according to the embodiments.
Figure 3:
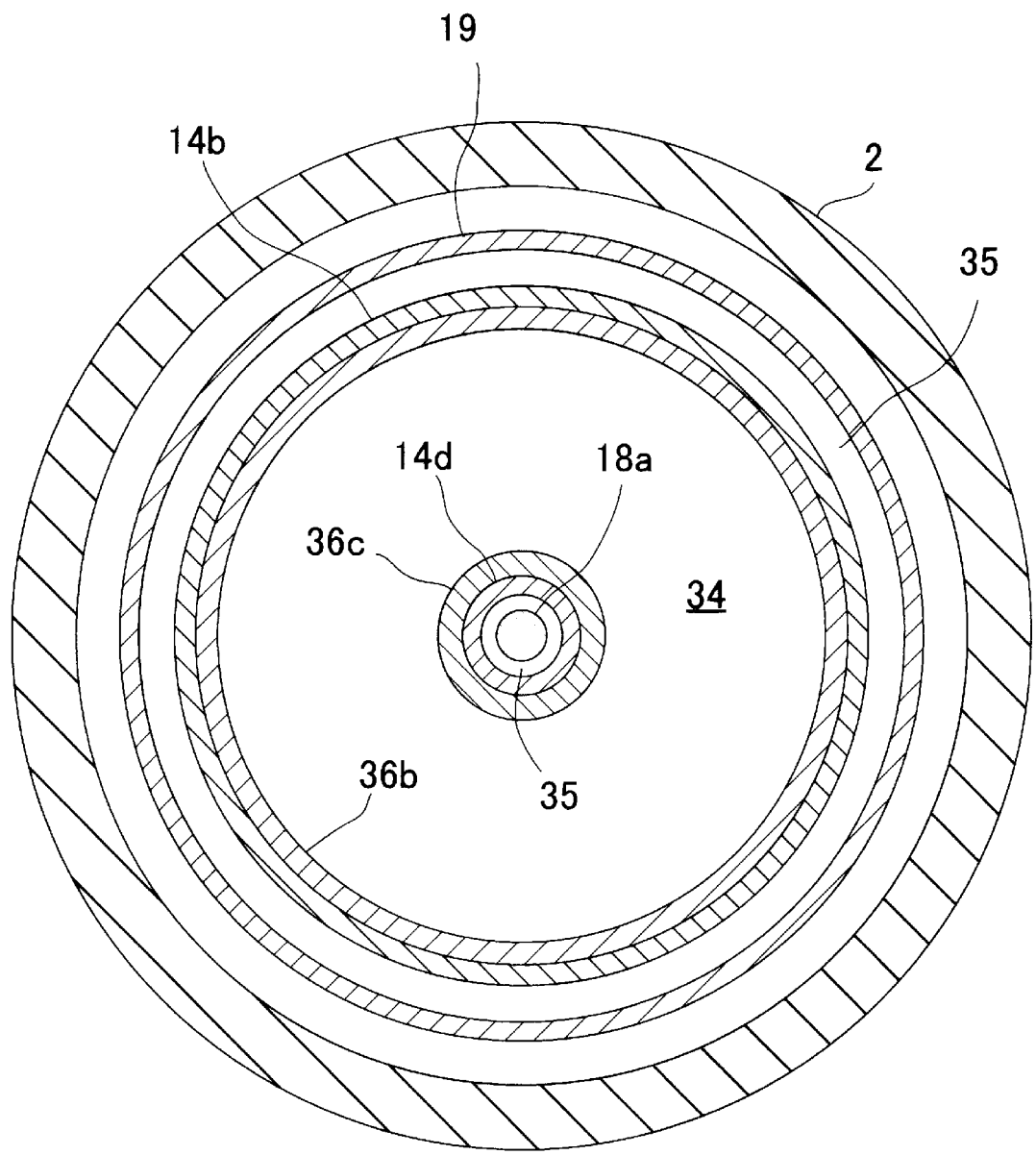
FIG. 3 schematically illustrates a cross-section taken along the line A-A of the substrate processing apparatus shown in FIG. 2.

First, the embodiments according to the technique of the present disclosure will be described with reference to FIGS. 1 through 3.

In the embodiments, a substrate processing apparatus is configured as a vertical type substrate processing apparatus (hereinafter, also simply referred to as a "processing apparatus") 1. For example, the processing apparatus 1 is configured to perform a substrate processing such as a heat treatment process as a part of manufacturing processes of a semiconductor device.

As shown in FIG. 1, the processing apparatus 1 includes a reaction tube 2 of a cylindrical shape and a main heater (hereinafter, also simply referred to as a "heater") 3 serving as a heating device (heating mechanism) provided at an outer periphery of the reaction tube 2. For example, the reaction tube 2 is made of a material such as quartz (SiO) and silicon carbide (SiC). A process chamber 5 in which a plurality of wafers including a wafer W serving as a substrate is processed is provided in a reaction vessel 4 which will be described later. A temperature detector 6 serving as a temperature detecting device is provided in the reaction tube 2. The temperature detector 6 is provided vertically along an inner wall of the reaction tube 2.

A manifold 7 of a cylindrical shape is connected to a lower end opening of the reaction tube 2 via a sealing part 8 such as an O-ring. The manifold 7 is configured to support a lower end of the reaction tube 2. The manifold 7 is made of a metal such as stainless steel. The reaction vessel 4 is constituted by the reaction tube 2 and the manifold 7.

A lower end opening (also referred to as a "furnace opening" or "vestibule") of the reaction vessel 4 is opened or closed by a lid part (also referred to as a "door") 9 of a disk shape. For example, the lid part 9 is made of a metal. A rotating shaft 18a of a boat supporting part (also referred to as a "boat receiver") 18 passes through a center portion of the lid part 9 on the same axis as that of the reaction tube 2. The rotating shaft 18a is pivotally supported by a rotating mechanism 22 provided on a lower surface of the lid part 9.

A cap 14 is provided on an upper surface of the lid part 9 via a sealing part 13 such as an O-ring. For example, the cap 14 is made of a material such as quartz. The cap 14 is formed in such a shape as to be inserted into the reaction vessel 4 through an opening, and is configured to have sufficient strength. For example, the cap 14 is of concentric cylinder shape (centrally convex shape). A sealing part 15 such as an O-ring is provided on an upper surface of a flange 14c of the cap 14. A lower end of the manifold 7 may be closed by the cap 14 via the sealing part 15. When the lower end of the manifold 7 is closed by the cap 14, an inner atmosphere of the reaction vessel 4 is hermetically (air-tightly) sealed from an outside atmosphere (air). The furnace opening portion will be described later in detail.

The process chamber 5 is configured to accommodate a boat 17 serving as a substrate retainer therein. The boat 17 is configured to support the plurality of the wafers including the wafer W, for example, from 25 to 150 wafers in a vertical direction in a multistage manner. For example, the boat 17 is made of a material such as quartz and SiC. The boat 17 is supported above the cap 14 by the boat receiver 18. For example, the boat receiver 18 is made of quartz. The boat receiver 18 may include the rotating shaft 18a and a boat placement portion 18b of a disk shape. The boat placement portion 18b is connected to an upper end of the rotating shaft 18a and has a surface (also referred to as a "boat placing surface") perpendicular to the rotating shaft 18a.

The thickness of the boat placement portion 18b of the boat receiver 18 is reduced at the periphery thereof in two steps: the first step into which a bottom plate 17a of a ring shape is fitted; and the second step at which a cap cover 19 of a cylindrical shape is provided. The cap cover 19 is made of quartz and extends downward. The boat placement portion 18b and the cap cover 19 may be collectively referred to as a "cap cover". A bottom surface of the boat placement portion 18b may be opaque so that infrared rays can be easily scattered.

The lid part 9 may be moved upward or downward in the vertical direction by a boat elevator 23 serving as an elevating mechanism. Thereby, the boat 17 and the lid part 9 are elevated or lowered in the vertical direction together, and the boat 17 is transferred (loaded) into the reaction vessel 4 or transferred (unloaded) out of the reaction vessel 4.

The processing apparatus 1 includes a gas supply mechanism 24 configured to supply gases used for the substrate processing into the process chamber 5. The gases supplied by the gas supply mechanism 24 may be changed according to which type of film is to be formed by the substrate processing. In the embodiments, for example, the gas supply mechanism 24 includes a source gas supply mechanism, a reactive gas supply mechanism and an inert gas supply mechanism.

The source gas supply mechanism includes a gas supply pipe 25a. A mass flow controller (MFC) 26a serving as a flow rate controller (flow rate control mechanism) and a valve 27a serving as an opening/closing valve are sequentially installed at the gas supply pipe 25a from an upstream side to a downstream side of the gas supply pipe 25a. A downstream end of the gas supply pipe 25a is connected to a nozzle 28a penetrating a side wall of the manifold 7. The nozzles 28a is provided vertically in the reaction tube 2. A plurality of gas supply holes is provided at the nozzles 28a. The plurality of the gas supply holes of the nozzles 28a is opened toward the plurality of the wafers including the wafer W supported by the boat 17. A source gas is supplied to the plurality of the wafers including the wafer W through the plurality of the gas supply holes of the nozzle 28a.

Similarly, a reactive gas is supplied to the plurality of the wafers including the wafer W from the reactive gas supply mechanism through a gas supply pipe 25b, an MFC 26b, a valve 27b and a nozzle 28b. Similarly, an inert gas is supplied to the plurality of the wafers including the wafer W from the inert gas supply mechanism through gas supply pipes 25c and 25d, MFCs 26c and 26d, valves 27c and 27d and the nozzles 28a and 28b.

An exhaust pipe 29 is provided at the reaction vessel 4. A vacuum pump 33 serving as a vacuum exhaust apparatus is connected to the exhaust pipe 29 through a pressure sensor 31 and an APC (Automatic Pressure Controller) valve 32. The pressure sensor 31 serves as a pressure detector (also referred to as a "pressure detection mechanism") configured to detect an inner pressure of the process chamber 5, and the APC valve 32 serves as a pressure controller (also referred to as a "pressure adjusting mechanism"). According to the configurations of the exhaust pipe 29, the pressure sensor 31, the APC valve 32 and the vacuum pump 33 described above, it is possible to set (adjust) the inner pressure of the process chamber 5 to a processing pressure according to the substrate processing. The exhaust pipe 29 may be connected to the manifold 7, or may be connected to the vicinity of the furnace opening of the reaction tube 2 or to an upper end (closed end) of the reaction tube 2 such that the exhaust pipe 29 is fluidically communicable with the manifold 7, the vicinity of the furnace opening portion or the upper end (closed end) of the reaction tube 2. However, when the exhaust pipe 29 is mainly provided at the upper end of the reaction tube 2, it may be preferable to provide a thin exhaust pipe (also referred to as an "auxiliary exhaust pipe") configured to exhaust a purge gas below a wafer processing region which will be describe later.

A gas supply pipe 37 configured to supply a purge gas 20 is connected to the rotating mechanism 22. A mass flow controller (MFC) 38 and a valve 39 are sequentially installed at the gas supply pipe 37 from an upstream side to a downstream side of the gas supply pipe 37. A purge gas supply mechanism is constituted by the gas supply pipe 37, the MFC 38 and the valve 39. The purge gas 20 is introduced (supplied) upward along the rotating shaft 18a from the rotating mechanism 22. For example, N2 gas serving as an inert gas may be used as the purge gas 20.

Hereinafter, the furnace opening portion will be described. As shown in FIG. 2, according to the embodiments, an external heat insulation type configuration is exemplified. That is, a heat insulating portion 34 is disposed outside (atmospheric side) the process chamber 5 in a heat insulating region below the wafer processing region. As shown in FIG. 2, the cap 14 is constituted by: an upper plate portion 14a defining a gap of a predetermined size with the boat placement portion 18b; a side surface portion 14b extending downward from the periphery of the upper plate portion 14a and defining a gap of a predetermined size with the cap cover 19; the flange 14c extending radially outward from a lower end of the side surface portion 14b; and a cylindrical portion 14d serving as a through-hole provided at a center portion which is located on or near a center axis of a cylinder formed by the side surface portion 14b. The cap 14 is provided so that the upper plate portion 14a and the side surface portion 14b protrude toward the reaction tube 2, that is, the upper plate portion 14a and the side surface portion 14b are inserted in the process chamber 5. A diameter of the cylinder formed by the side surface portion 14b is sufficiently smaller than a diameter of the reaction tube 2. As shown in FIG. 3, a cross-section of the cap 14 is of a circular shape, and the rotating shaft 18a passes through the cylindrical portion 14d.

The heat insulating portion 34 is provided in a hollow portion inside the cap 14. That is, the heat insulating portion 34 is provided in an annular space formed between the side surface portion 14b and the cylindrical portion 14d. For example, the heat insulating portion 34 is made of a material such as a carbon felt and a ceramic fiber molded body. A heater 36 serving as a heating mechanism (also referred to as a "cap heater") is provided between the heat insulating portion 34 and the cap 14. The heater 36 is provided to compensate for the heat dissipation (heat escape) through the cap 14. The heater 36 is installed so as to cover an inside of the cap 14. The annular space may be in communication with the atmospheric air or an ambient atmosphere of substantially atmospheric pressure. The heater 36 may be provided apart from the cap 14. In addition, the heat insulating portion 34 may be fixed on the lid part 9 (that is, on a cap holding plate 9b).

The heater 36 is constituted by a first heater (also referred to as a "first heating mechanism") 36a, a second heater (also referred to as a "second heating mechanism") 36b, and a third heater (also referred to as a "third heating mechanism") 36c. The first heater 36a is installed so as to cover an inner surface of the upper plate portion 14a, and is configured to heat wafers located at a lower portion of the boat 17 among the plurality of the wafers including the wafer W. As shown in FIG. 3, the second heater 36b is installed so as to cover an inner surface of the side surface portion 14b, and is configured to heat the furnace opening portion provided at a lower portion of the reaction vessel 4. The second heater 36b may include a plurality of divided heaters divided in the vertical direction (height direction). The third heater 36c is installed so as to cover the circumference of the cylindrical portion 14d, and is configured to heat the rotating shaft 18a. The heater 36 may be embodied by stacking components such as a heating wire (resistor), an insulating material configured to support the heating wire or to hold the heating wire so as to maintain its shape, a metal plate configured to reduce the temperature non-uniformity, and a heat resistant cloth configured to electrically insulate the heating wire and the metal plate. Since the first heater 36a is provided near the wafer processing region, it is preferable that the first heater 36a can withstand a temperature of 600° C. or more. In addition, it is preferable that the heat generation amount (heat generation density) per unit area of each of the first heater 36a through the third heater 36c corresponds to the heat dissipation amount (heat escape amount) per unit area passing through the cap 14. However, for simplicity, the heat generation amount may be set equal to the heat dissipation amount. For example, by causing the second heater 36b to sufficiently generate the heat even in the vicinity of the furnace opening portion where the temperature is relatively low (that is, a portion where the heat escape is relatively less), an inner peripheral surface of the manifold 7 is directly heated by the radiation. As a result, it is possible to suppress the adhesion of by-products due to the low temperature. In addition, the heating wires of the first heater 36a to the third heater 36c may be connected in series or in parallel, and may be used as a common power supply line (also referred to as a "common wire"). The heater 36 (for example, the second heater 36b) may be provided with a temperature detector such as a thermocouple in order to control the temperature thereof.

The rotating shaft 18a of the boat receiver 18 is of a cylindrical shape with a substantially constant outer diameter and inner diameter. An upper end of the rotating shaft 18a is closed by the boat placement portion 18b and a lower end of the rotating shaft 18a is open. In addition, a heat radiator (also referred to as an "auxiliary heating device" or "auxiliary heater") 52 serving as an auxiliary heating mechanism is provided in the rotating shaft 18a at an upper end side of the rotating shaft 18a, and a shaft heat insulating portion 53 is provided (installed) below the heat radiator 52. The wafers located at the lower portion of the boat 17 among the plurality of the wafers including the wafer W can be heated also from central portions thereof by the heat radiator 52. For example, the heat radiator 52 may be embodied by an electric heating type radiator using a heating wire (resistance wire) similar to that of the heater 36, may be embodied by a lamp heating type radiator, or may be embodied by an indirect heating type radiator using a pseudo black body capable of absorbing the heat from the heater such as the third heater 36c and capable of dissipating the heat upward instead of generating the heat by itself. A power supply line of the heat radiator 52 may be inserted inside the shaft heat insulating portion 53. The heat radiator 52 and the shaft heat insulating portion 53 may be fixedly provided instead of rotating together with the rotating shaft 18a. When the heat radiator 52 and the shaft heat insulating portion 53 is fixedly provided, the shaft heat insulating portion 53 may be made of a hard material that can stand on its own (having a rigid shape).

As described above, the thickness of the boat placement portion 18b of the boat receiver 18 is reduced at the periphery thereof in two steps: the first step into which the bottom plate 17a of a ring shape is fitted; and the second step into which an upper end of the cap cover 19 is fitted.

The cap cover 19 covers the circumference of the cap 14 with a gap of a predetermined size throughout the entire length along the axial direction, and the gap has a cross-section whose shape is same along the axial direction. The upper end of the cap cover 19 includes a protrusion protruding inward in the radial direction, and the protrusion is supported by the second step of the boat placement portion 18b. A discharge port 21 having a predetermined size is defined (formed) between a lower end of the cap cover 19 and the upper surface of the flange 14c. A purge gas flow path 35 through which the purge gas 20 flows is constituted by an inside of the cylindrical portion 14d, the gap provided (formed) between the upper plate portion 14a and a lower surface of the boat placement portion 18b, and the gap provided (formed) between the side surface portion 14b and the cap cover 19. That is, the purge gas 20 is introduced (supplied) upward along the rotating shaft 18a from the rotating mechanism 22, flows upward along the purge gas flow path 35, then flows radially outward and then downward, and is discharged through the discharge port 21 to the furnace opening portion.

The lid part 9 is configured by overlapping a lid base 9a and the cap holding plate (also referred to as a "cap holder") 9b. The lid base 9a and the cap holding plate 9b are both configured as a circular metal plate provided with an opening at the center thereof. The cap holding plate 9b provided on a side of the reaction vessel 4 may be heated to about 300° C. by the heat transfer in the process chamber 5. The cap holding plate 9b is joined to the lid base 9a in the vicinity of the center thereof, and a gap is provided between the cap holding plate 9b and the lid base 9a except for the joined surface between the cap holding plate 9b and the lid base 9a. A hole for inserting a power supply line (lead wire) of the heater 36 or an access hole for tightening and loosening a cap nut 30 (described later) may be appropriately provided at the lid base 9a or the cap holding plate 9b.

The cap 14 is fixed by interposing the flange 14c between the cap holding plate 9b and the manifold 7. A coolant channel 16 is provided in the vicinity of the sealing part 13 of the cap holding plate 9b. A coolant such as cooling water flows through the coolant channel 16 so that the sealing parts 13 and 15 can be cooled. The furnace opening portion may be configured by manifold 7, lid part 9, adapter 12, cap 14, boat receiver 18, cap cover 19 and rotating mechanism 22 and also referred to as a "furnace opening assembly".

Hereinafter, the rotating mechanism 22 and its periphery will be described. The rotating mechanism 22 is fixed to the lid base 9a via an adapter (also referred to as a "fixing tool") 12. The adapter 12 is of a substantially cylindrical shape, and is coupled to the lid base 9a in the vicinity of a center of the lid base 9a. On an upper end side of the adapter 12, an outer periphery of the cylindrical portion 14d is inserted into the adapter 12. A screw thread is cut on an outer periphery on the upper end side of the adapter 12. The cap nut 30 is screwed into an upper end portion of the adapter 12. A sealing part 40 such as an O-ring is pressed against the adapter 12 and the cylindrical portion 14d to seal between them. A ferrule that can bear an axial load from the rotating shaft 18a may be provided between the cap nut 30 and the sealing part 40 or may be provided on the outer periphery of the cylindrical portion 14d. In addition, a closable access hole for tightening and loosening a cap nut 56 described later may be provided on a side surface of the adapter 12.

For example, a magnetic fluid seal serving as a rotary feedthrough device for vacuum, is provided at the rotating mechanism 22 so that the rotating shaft 18a is configured to be rotatable while the inside of the reaction vessel 4 is hermetically sealed. The rotating mechanism 22 includes a casing (body) 41 of a substantially cylindrical shape with an open upper end and a closed lower end. The casing 41 is fixed to the adapter 12 with a fixing part such as a bolt. The casing 41 is provided with an introduction port 37a for introducing (supplying) the purge gas 20. From an inside of the casing 41, an inner shaft 42 of a cylindrical shape and an outer shaft 43 of a cylindrical shape are provided in order coaxially in the casing 41. A diameter of the outer shaft 43 is greater than that of the inner shaft 42. In addition, the outer shaft 43 may be rotatably supported by a pair of inner bearings 44 and 45 interposed (provided) between the outer shaft 43 and the inner shaft 42 and a pair of outer bearings 46 and 47 interposed between the outer shaft 43 and the casing 41. The inner bearings 44 and 45 constitute a vertically arranged pair, and the outer bearings 46 and 47 constitute another vertically arranged pair. The inner shaft 42 is fixed to the casing 41 so that it cannot rotate. In addition, the inner bearings 44 and 45 are not essential and may not be provided.

A magnetic fluid seal 49 is provided above the outer bearing 46 (that is, provided at a side of the outer bearing 46 facing the process chamber 5) to separate the vacuum atmosphere and the air of atmospheric pressure. A worm wheel or a pulley 51 that is driven by a component such as an electric motor (not shown) is mounted (provided) at the outer shaft 43.

A support rod 54 made of a heat resistant resin is vertically inserted and fixed inside the inner shaft 42. For example, the support rod 54 is a round bar having a diameter smaller than the inner diameter of the rotating shaft 18a. A hole through which the power supply line of the auxiliary heater 52 is inserted is provided in the support rod 54. The shaft heat insulating portion 53 is supported by the support rod 54 at an upper end of the support rod 54.

In addition, a coupling part 50 is provided on an upper surface of the outer shaft 43 whose upper end is of a flange shape. The rotating shaft 18a is fitted on an upper side of the coupling part 50 via a sealing part 55a such as a face seal. The coupling part 50 is of a flange shape having a flat bottom surface, and is airtightly coupled to the outer shaft 43 using an appropriate component such as a metal seal. A screw thread is cut on an outer periphery on the upper side of the coupling part 50, and a cylindrical portion (not shown) of the coupling part 50 is provided such that its inner periphery is fitted to an outer periphery of the rotating shaft 18a at predetermined fitting portions. The cap nut 56 is screwed into the outer periphery of the cylindrical portion of the coupling part 50, and a sealing part 55b such as an O-ring provided between the coupling part 50 and the cap nut 56. The sealing part 55b is pressed against the coupling part 50 and the rotating shaft 18a by the cap nut 56. As a result, the rotating shaft 18a, the coupling part 50 and the outer shaft 43 constitutes an airtight single cylinder. On the other hand, the cylindrical portion 14d of the cap 14, the adapter 12 and the casing 41 also constitutes an airtight single cylinder. A space between these cylinders (which constitutes the purge gas flow path 35) is closed by the magnetic fluid seal 49 at lower ends thereof. As a result, the purge gas flow path 35 and the process chamber 5 communicating therewith are maintained airtight. In other words, a space between the cylindrical portion 14d and the rotating shaft 18a communicates with the magnetic fluid seal 49 in the rotating mechanism 22. The introduction port 37a for introducing (supplying) the purge gas 20 communicates with a space above the magnetic fluid seal 49 and introduces (supplies) the purge gas 20 from the vicinity of a lower end of the purge gas flow path 35.

Components such as the rotating mechanism 22, the boat elevator 23, the MFCs 26a through 26d of the gas supply mechanism 24, the valves 27a through 27d of the gas supply mechanism 24, the APC valve 32, the vacuum pump 33, the MFC 38 of the purge gas supply mechanism, the valve 39 of the purge gas supply mechanism, the heater 3, the heater 36, and the auxiliary heater 52 are connected to a controller 57 and controlled by the controller 57. For example, the controller 57 is embodied by a microprocessor (computer) with a CPU (central processing unit), and is configured to control the operations of the processing apparatus 1. An input/output device 58 such as a touch panel is connected to the controller 57.

A memory device 59 serving as a recording medium is connected to the controller 57. A control program for controlling the operations of the processing apparatus 1 or a program (also referred to as a "recipe") configured to control the components of the processing apparatus 1 according to the process conditions to perform the substrate processing is readably stored in the memory device 59

The memory device 59 may be embodied by a built-in memory device (such as a hard disk and a flash memory) of the controller 57, or may be embodied by a portable external recording device (for example, a magnetic tape, a magnetic disk such as a flexible disk and a hard disk, an optical disk such as a CD and a DVD, a magneto-optical disk such as an MO, and a semiconductor memory such as a USB memory and a memory card). The program may be provided to the computer using a communication means such as the Internet and a dedicated line. For example, the program may be read from the memory device 59 in accordance with an instruction inputted from the input/output device 58 when necessary. By executing the substrate processing by the controller 57 according to the read recipe, the processing apparatus 1 performs a desired processing (that is, the substrate processing) under the control of the controller 57.

Hereinafter, an example of the substrate processing (film-forming process) of forming a film on a substrate using the processing apparatus 1 will be described. In the substrate processing, for example, HCDS ($Si_2Cl_6$: hexachlorodisilane) gas serving as the source gas and $H_2O$ (water vapor) gas serving as the reactive gas are supplied to the wafer W to form a silicon oxide ($SiO_2$) film on the wafer W. In the following description, the components of the processing apparatus 1 are controlled by the controller 57.

Wafer Charging and Boat Loading Step

After the boat 17 is charged with the plurality of the wafers including the wafer W (wafer charging step), the boat 17 is elevated by the boat elevator 23 and loaded (transferred) into the process chamber 5 (boat loading step). With the boat 17 loaded, the lid part 9 hermetically seals (closes) the lower end opening of the reaction vessel 4.

Pressure Adjusting and Temperature Adjusting Step

The vacuum pump 33 exhausts (vacuum-exhausts) an inner atmosphere of the process chamber 5 until the inner pressure of the process chamber 5 reaches a desired pressure (vacuum degree) (pressure adjusting step). In the pressure adjusting step, the inner pressure of the process chamber 5 is measured by the pressure sensor 31, and the APC valve 32 is feedback-controlled based on the measured pressure. The heater 3, the first heater 36a and the auxiliary heater 52 heat the process chamber 5 such that a temperature of the plurality of wafers including the wafer W in the process chamber 5 reaches a desired temperature and maintains the desired temperature (temperature adjusting step). In the temperature adjusting step, the amounts of the current flowing to the heater 3, the first heater 36a and the auxiliary heater 52 are feedback-controlled based on the temperature detected by the temperature detector 6 such that an inner temperature of the process chamber 5 has a desired temperature distribution. In addition, the second heater 36b and the third heater 36c start to heat the process chamber 5, and the boat 17 and the plurality of the wafers including the wafer W are rotated by the rotating mechanism 22.

The valve 39 is opened to supply the purge gas 20 from the purge gas supply mechanism. The purge gas 20 is introduced (supplied) through the introduction port 37a provided at the casing 41, and fills a space surrounded by the component such as the casing 41 and the magnetic fluid seal 49. Thereafter, the purge gas 20 flows upward in the cylindrical portion 14d along the rotating shaft 18a and flows into the purge gas flow path 35. The purge gas 20 that has flowed into the purge gas flow path 35 spreads in the radial direction along the lower surface of the boat placement portion 18b, flows downward along an inner peripheral surface of the cap cover 19, and is discharged through the discharge port 21 to the furnace opening portion.

Film-Forming Process

The film-forming process is performed by performing a cycle including the following four steps (that is, a source gas supply step, a source gas exhaust step, a reactive gas supply step and a reactive gas exhaust step) a predetermined number of times (at least once).

Source Gas Supply Step

After the inner temperature of the process chamber 5 is stabilized at a predetermined processing temperature, the HCDS gas is supplied to the wafer W in the process chamber 5. A flow rate of the HCDS gas is adjusted by the MFC 26a, and the HCDS with the flow rate thereof adjusted is supplied to the wafer W in the process chamber 5 through the gas supply pipe 25a and the nozzle 28a.

Source Gas Exhaust Step

Next, the supply of the HCDS gas is stopped, and the vacuum pump 33 vacuum-exhausts the inner atmosphere of the process chamber 5. In the source gas exhaust step, N2 gas serving as the inert gas may be supplied into the process chamber 5 from the inert gas supply mechanism (purge by inert gas).

Reactive Gas Supply Step

Next, the $H_2O$ gas is supplied to the wafer W in the process chamber 5. A flow rate of the $H_2O$ gas is adjusted by the MFC 26b, and the $H_2O$ with the flow rate thereof adjusted is supplied to the wafer W in the process chamber 5 through the gas supply pipe 25b and the nozzle 28b.

Reactive Gas Exhaust Step

Next, the supply of the $H_2O$ gas is stopped, and the vacuum pump 33 vacuum-exhausts the inner atmosphere of the process chamber 5. In the reactive gas exhaust step, the N2 gas serving as the inert gas may be supplied into the process chamber 5 from the inert gas supply mechanism (purge by inert gas).

By performing the cycle including the above-described four steps (that is, the source gas supply step, the source gas exhaust step, the reactive gas supply step and the reactive gas exhaust step) a predetermined number of times (at least once), it is possible to form the silicon oxide ($SiO_2$) film having a predetermined composition and a predetermined thickness on the surface of the wafer W. The purge gas 20 is continuously supplied from the purge gas supply mechanism during the above-described four steps. In addition, the supply of the purge gas 20 may be started from a standby state before performing the wafer charging step.

Boat Unloading and Wafer Discharging Step

After the silicon oxide film having the predetermined thickness is formed, the N2 gas is supplied into the process chamber 5 from the inert gas supply mechanism. The inner atmosphere of the process chamber 5 is replaced with the N2 gas, and the inner pressure of the process chamber 5 is returned to the normal pressure. Thereafter, the lid part 9 is lowered by the boat elevator 23, and the boat 17 is unloaded (transferred) out of the reaction vessel 4 (boat unloading step). Thereafter, a plurality of processed wafers including the wafer W is then discharged (transferred) from the boat 17 (wafer discharging step).

For example, the process conditions for forming the SiO$_2$ film on the wafer W are as follows:
Processing Temperature (wafer temperature): 300° C. to 700° C.;
Processing Pressure (the inner pressure of the process chamber): 1 Pa to 4,000 Pa;
Flow rate of HCDS gas: 100 sccm to 10,000 sccm;
Flow rate of H$_2$O gas: 100 sccm to 10,000 sccm; and
Flow rate of N$_2$ gas: 100 sccm to 10,000 sccm.

By selecting suitable values within these process conditions described above, it is possible to perform the film-forming process properly.

During the film-forming process, a heating temperature of the heater 36 is set (adjusted) such that a temperature of the first heater 36a is approximately the same as the processing temperature and a temperature of the second heater 36b is lower than that of the first heater 36a. Specifically, the temperature of the second heater 36b is set to a temperature at which no by-product is adhered to the furnace opening portion, for example, 200° C. to 300° C. When the temperature of the second heater 36b is higher than that of the first heater 36a, a process gas such as the source gas and the reactive gas may be decomposed in the vicinity of the furnace opening portion, or the temperature uniformity in the process chamber 5 may be deteriorated. In addition, a temperature of the third heater 36c is set to a temperature lower than that of the second heater 36b, for example, about 150° C. When the temperature of the third heater 36c is higher than that of the second heater 36b, the by-products may adhere to the rotating shaft 18a. In addition, a heating temperature of the auxiliary heater 52 is set to a temperature approximately equal to the temperature of the first heater 36a.

According to the embodiments described above, it is possible to provide at least one or more of the following effects.

(a) It is possible to provide the heat insulating portion 34 outside the process chamber 5 by providing the cap 14 of concentric cylinder shape (centrally convex shape). Thereby, it is possible to suppress the heat insulating portion 34 from adversely affecting the wafer W due to its constituent material, and it is possible to improve the quality of the substrate processing. In addition, by positioning the heat insulating portion 34 outside the process chamber 5, it is possible to reduce the volume inside the process chamber 5. Therefore, it is possible to shorten the time required to decrease or increase the inner pressure of the process chamber 5, and it is also possible to increase the throughput of the substrate processing.

(b) By providing a cap cover 19 that covers the circumference of the cap 14, the purge gas 20 introduced along the rotating shaft 18a sequentially flows through the purge gas flow path 35 along the boat placement portion 18b and the cap cover 19, and is discharged through the discharge port 21 to the furnace opening portion. Accordingly, it is possible to reduce a gas concentration of the source gas since the source gas at the furnace opening portion is diluted. As a result, it is possible to suppress the adhesion of the by-products to the furnace opening portion.

(c) It is possible to prevent the purge gas 20 from discharging (releasing) to the lower portion of the boat 17, that is, a portion below the wafer processing region. Therefore, the purge gas 20 does not dilute the gas concentration of the source gas below the wafer processing region. As a result, it is possible to suppress the deterioration of the thickness uniformity of the film formed on the surfaces of the plurality of wafers including the wafer W. In addition, since the temperature lowering of the portion below the wafer processing region due to the purge gas 20 can be prevented, it is possible to shorten the time required to increase the inner temperature of the process chamber 5, and it is also possible to improve the productivity of the substrate processing.

(d) Since the purge gas 20 circulates (flows) along the boat placement portion 18b and the cap cover 19 through the purge gas flow path 35, it is possible to lengthen a flow path of the purge gas 20. Therefore, it is possible to improve the effect of purging by the purge gas 20.

(e) When a heat insulating material is provided (disposed) in the process chamber 5, the contamination due to the constituent of the heat insulating material may occur. Therefore, the constituent of the heat insulating material may be limited to such material as quartz and silicon carbide. However, according to the embodiments described above, it is possible to arbitrarily select the constituent material of the heat insulating portion 34 by installing the heat insulating portion 34 outside the process chamber 5. For example, by selecting a material having a high heat insulating effect as the constituent material of the heat insulating portion 34, it is possible to shorten the heat insulating region, and it is also possible to lengthen a product region (that is, the wafer processing region). Thereby, it is possible to improve the productivity. In addition, it is possible to cope with a higher temperature process. In addition, by selecting a material having a small heat capacity as the heat insulating material of the heat insulating portion 34, it is possible to shorten a recovery time when the inner temperature of the process chamber 5 is elevated, and it is also possible to further improve the productivity.

(f) By providing the heater 36 inside the cap 14, it is possible to assist the heating of the process chamber 5 by the heater 3, and it is also possible to improve a process stability of the substrate processing. In addition, by providing the auxiliary heater 52 inside the rotating shaft 18a, it is possible to suppress the heating non-uniformity due to heating the process chamber 5 from thereunder, and it is also possible to improve the heating uniformity.

(g) By providing the second heater 36b (also referred to as an "outer heater") in the cap 14, it is possible to heat a surface of a wall in the heat insulating region in contact with the process gas to increase a temperature of the surface of the wall, and as a result, it is also possible to suppress the adhesion of the by-products to the cap 14. Thereby, it is possible to suppress the generation of particles, and it is also possible to lengthen a maintenance cycle of the processing apparatus 1. In addition, by dividing the second heater 36b into a plurality of divided heaters in the vertical direction (height direction) and by adjusting temperatures of the plurality of the divided heaters individually, it is possible to adjust (set) a temperature as desired at each height. Therefore, it is possible to more effectively suppress the adhesion of the by-products.

(h) By providing the first heater 36a in the cap 14, it is possible to increase the temperature of a wafer located at a lower portion of the process chamber 5 among the plurality of the wafers including the wafer W at high speed, and it is also possible to shorten the recovery time. According to other substrate processing apparatuses, a dummy wafer may be installed at a bottom of the boat 17 in order to maintain a temperature of the wafer processing region uniform. However, according to the embodiments described above, it is possible to suitably control the heating by the first heater 36a. Therefore, it is possible to compensate for the heat escaping from the wafer W, and there is no need to provide the dummy wafer at the bottom of the boat 17. Thereby, since the soaking length can be increased, it is possible to increase the number of wafers to be processed including the wafer W, and it is also possible to improve the productivity.

(i) By providing the coolant channel 16 in the vicinity of the sealing part 13 of the cap holding plate 9b, it is possible to cool the sealing parts 13 and 15. Therefore, it is possible to suppress the burning of the sealing parts 13 and 15 due to the temperature elevation of the process chamber 5.

Other Embodiments

While the technique is described in detail by way of the above-described embodiments, the above-described technique is not limited thereto. The above-described technique may be modified in various ways without departing from the gist thereof.

Hereinafter, a first modified example of the embodiments described herein will be described with reference to FIG. 4.

According to the first modified example, the first heater 36a is divided into an inner heater 36a1 and an outer heater 36a2 to control the heat generation amounts by the inner heater 36a1 and the outer heater 36a2 individually. By dividing the first heater 36a, for example, a temperature of the inner heater 36a1 may be set higher than the temperature of the outer heater 36a2. Therefore, it is possible to improve the temperature uniformity of the wafer W at the lower portion of the process chamber 5. As a result, it is possible to improve the thickness uniformity on the surface of the wafer W and the quality uniformity of the film formed on the wafer W.

In addition, the first heater 36a may be divided into three of more heaters. By dividing the first heater 36a into a plurality of zone heaters in the radial direction, it is possible to adjust the temperature distribution on the surface of the wafer at a lowermost portion (bottom) of the wafer processing region.

Figure 4:
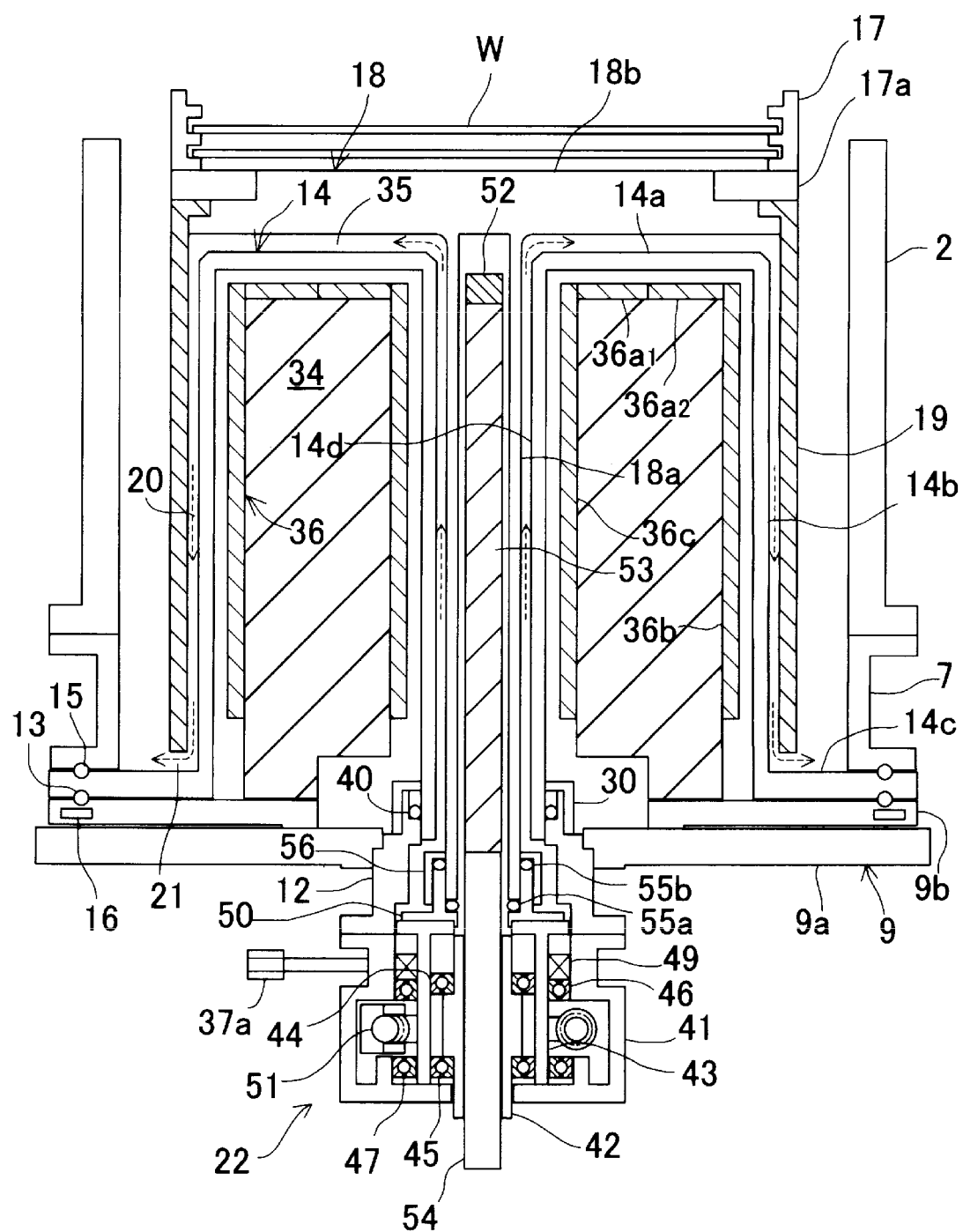
FIG. 4 is an enlarged view schematically illustrating a furnace opening portion of a process furnace of a substrate processing apparatus according to a first modified example of the embodiments described herein.

Referring to FIG. 4, the inner heater 36a1 and the outer heater 36a2 are exemplified as planar heaters. However, the inner heater 36a1 and the outer heater 36a2 are not limited thereto. For example, the inner heater 36a1 and the outer heater 36a2 may be annular heaters, respectively. Alternatively, the inner heater 36a1 and the outer heater 36a2 may have different heights. For example, by setting a height of the outer heater 36a2 lower than that of the inner heater 36a1, that is, bringing the inner heater 36a1 closer to the process chamber 5, it is possible to improve the film-forming uniformity of the wafer W at the lower portion of the process chamber 5.

Figure 5:
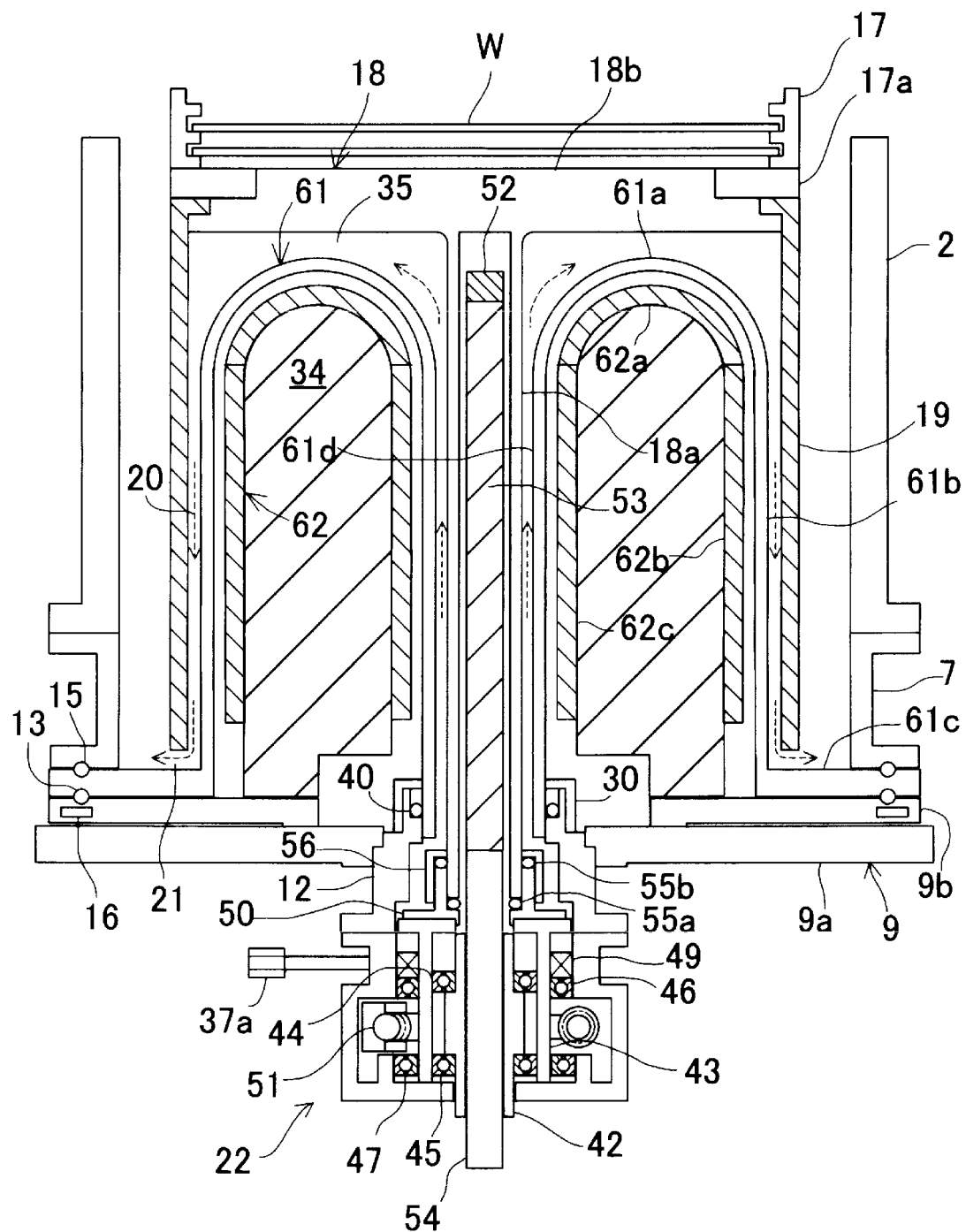
FIG. 5 is an enlarged view schematically illustrating a furnace opening portion of a process furnace of a substrate processing apparatus according to a second modified example of the embodiments described herein.

Hereinafter, a second modified example of the embodiments described herein will be described with reference to FIG. 5.

According to the second modified example, a cap 61 is constituted by a curved surface portion 61a having a convex curved surface (that is, a cross-section of the curved surface portion 61a is semicircular or elliptical), a side surface portion 61b, a flange portion 61c and a cylindrical portion 61d. Since the side surface portion 61b, the flange portion 61c and the cylindrical portion 61d are the same as the side surface portion 14b, the flange 14c and the cylindrical portion 14d, and thus descriptions thereof will be omitted.

A heater 62 includes a first heater 62a having a convex curved surface provided so as to cover an inner surface of the curved surface portion 61a, a second heater 62b provided so as to cover an inner surface of the side surface portion 61b and a third heater 62c provided so as to cover the circumference of the cylindrical portion 61d.

According to the second modified example, an upper portion of the cap 61 is the curved surface portion 61a having the convex curved surface. Therefore, it is possible to uniformly heat the wafer processing region from thereunder, and it is also possible to improve the film-forming uniformity of the wafer W at the lower portion of the process chamber 5.

The above-described embodiments and the modified examples may be appropriately combined. As described above, by providing the heat insulating portion 34 outside the process chamber 5, it is possible to freely select the constituent material of the heat insulating portion 34. In addition, it is possible to install the heater as desired. It is also possible to improve the characteristics such as the responsiveness when the temperature is elevated or lowered and the heat insulation controllability at the steady state.

In addition to manufacturing processes of integrated circuits, electronic devices and other semiconductor devices such as MEMS (Micro Electro Mechanical Systems) devices formed on the substrate using the semiconductor microfabrication technology, the technique described herein may also be widely used for forming various films such as metamaterials.

According to some embodiments in the present disclosure, it is possible to suppress the adhesion of by-products to a furnace opening portion and to purge a rotating shaft without affecting the film-forming uniformity on the surface of the substrate.

What is claimed is:

1. A substrate processing apparatus comprising:
a reaction vessel provided with an opening at a lower end thereof and accommodating a substrate retainer configured to support a substrate;
a rotary shaft having a cylindrical shape with a closed end inserted in the reaction vessel and configured to rotatably support the substrate retainer, wherein a heat insulator is provided in the rotary shaft;
a cap comprising:
   a side surface portion provided so as to maintain a predetermined gap with an inner surface of the reaction vessel when the cap is inserted into the reaction vessel;
   a cylindrical portion through which the rotary shaft is inserted at a center portion of the side surface portion;
   an upper plate portion of an annular shape connecting an upper end of the side surface portion to an upper end of the cylindrical portion; and
   a flange connected to a lower end of the side surface portion,
   wherein the cap is configured to hermetically close the reaction vessel by bringing the flange into direct or indirect contact with the opening; and
a cap cover connected to the rotary shaft above the upper end of the cylindrical portion and configured to cover an upper surface and a side surface of the cap,
wherein the rotary shaft comprises an auxiliary heater provided on a top of the heat insulator in vicinity of the closed end of the rotary shaft, and
the auxiliary heater is positioned at a height generally same with a height of a part of a cap heater allocated between a heat insulating member and the upper plate portion.

2. The substrate processing apparatus of claim 1, wherein the rotary shaft and the cylindrical portion are configured to allow a purge gas supplied to an outer periphery of the rotary shaft to initially flow through a space between the rotary shaft and the cylindrical portion, the upper plate portion, the side surface portion and the cap cover are configured to allow the purge gas to flow sequentially a space between the upper plate portion and the cap cover and a space between the side surface portion and the cap cover.

3. The substrate processing apparatus of claim 2, further comprising:
 a sealing member provided between the flange and the opening;
 an adapter airtightly connected to the cylindrical portion;
 a rotary feedthrough device fixed to the adapter and configured to support the rotary shaft rotatably; and
 a lid configured to support the cap while contacting a side of the flange opposite to another side of the flange in contact with the reaction vessel, the lid being configured to fix the adapter at a center of the lid,
 wherein an annular space is in communication with an atmospheric air or an ambient atmosphere of substantially atmospheric pressure.

4. The substrate processing apparatus of claim 3,
 wherein the rotary feedthrough device comprises an outer shaft supported rotatably and an inner shaft arranged concentrically with the outer shaft, and
 wherein the rotary shaft is airtightly connected to the outer shaft by a connector.

5. The substrate processing apparatus of claim 3, wherein each of the side surface portion and a portion of the reaction vessel facing the side surface portion has a cross-section whose shape is same along an axial direction of the rotary shaft.

6. The substrate processing apparatus of claim 3, wherein the lid comprises a coolant channel provided at a location close to the sealing member to cool the sealing member.

7. The substrate processing apparatus of claim 1, wherein the cap further comprises:
 the heat insulating member provided in an annular space formed between the side surface portion and the cylindrical portion; and
 the cap heater provided in the annular space.

8. The substrate processing apparatus of claim 7, wherein the cap heater spread between the heat insulating member and the side surface portion, between the heat insulating member and the upper plate portion, and between the heat insulating member and the cylindrical portion.

9. The substrate processing apparatus of claim 1, wherein the cap heater provided at least one of between the heat insulating member and the side surface portion, between the heat insulating member and the upper plate portion, and between the heat insulating member and the cylindrical portion.

10. A substrate processing apparatus comprising:
 a reaction vessel provided with an opening at a lower end thereof and accommodating a substrate retainer configured to support a substrate;
 a rotary shaft configured to rotatably support the substrate retainer;
 a cap comprising:
  a side surface portion provided so as to maintain a predetermined gap with an inner surface of the reaction vessel when the cap is inserted into the reaction vessel;
  a cylindrical portion through which the rotary shaft is inserted at a center portion of the side surface portion;
  an upper plate portion of an annular shape connecting an upper end of the side surface portion to an upper end of the cylindrical portion; and
  a flange connected to a lower end of the side surface portion,
  wherein the cap is configured to hermetically close the reaction vessel by bringing the flange into direct or indirect contact with the opening;
 a cap cover connected to the rotary shaft above the upper end of the cylindrical portion and configured to cover an upper surface and a side surface of the cap, wherein the rotary shaft and the cylindrical portion are configured to allow a purge gas supplied to an outer periphery of the rotary shaft to initially flow through a space between the rotary shaft and the cylindrical portion, the upper plate portion, the side surface portion and the cap cover are configured to allow the purge gas to flow sequentially a space between the upper plate portion and the cap cover and a space between the side surface portion and the cap cover;
 a sealing member provided between the flange and the opening;
 an adapter airtightly connected to the cylindrical portion;
 a rotary feedthrough device fixed to the adapter, configured to support the rotary shaft rotatably, and comprising an outer shaft supported rotatably and an inner shaft arranged concentrically with the outer shaft;
 a lid configured to support the cap while contacting a side of the flange opposite to another side of the flange in contact with the reaction vessel, the lid being configured to fix the adapter at a center of the lid; and
 a heat insulator or an auxiliary heater supported by the inner shaft inside the rotary shaft with a cylindrical shape and a closed end inserted in the reaction vessel,
 wherein an annular space is in communication with an atmospheric air or an ambient atmosphere of substantially atmospheric pressure, and
 wherein the rotary shaft is airtightly connected to the outer shaft by a connector.

11. A furnace opening assembly for substrate processing apparatuses comprising:
 a rotary shaft configured to rotatably support a substrate retainer inside a reaction vessel;
 a cap comprising:
  a side surface portion provided so as to maintain a predetermined gap with an inner surface of the reaction vessel when the cap is inserted into the reaction vessel;
  a cylindrical portion through which the rotary shaft is inserted at a center portion of the side surface portion;
  an upper plate portion of an annular shape connecting an upper end of the side surface portion to an upper end of the cylindrical portion; and
  a flange connected to a lower end of the side surface portion,
  wherein the cap is configured to hermetically close the reaction vessel by bringing the flange into direct or indirect contact with a lower opening of the vessel;
 a cap cover connected to the rotary shaft above the upper end of the cylindrical portion and configured to cover an upper surface and a side surface of the cap, wherein the rotary shaft and the cylindrical portion are configured to allow a purge gas supplied to an outer periphery of the rotary shaft to initially flow through a space between the rotary shaft and the cylindrical portion, the upper plate portion, the side surface portion and the cap cover are configured to allow the purge gas to flow sequentially a space between the upper plate portion and the cap cover and a space between the side surface portion and the cap cover;

an adapter airtightly connected to the cylindrical portion;

a rotary feedthrough device fixed to the adapter, configured to support the rotary shaft rotatably, and comprising an outer shaft supported rotatably and an inner shaft arranged concentrically with the outer shaft; and a heat insulator or an auxiliary heater supported by the inner shaft inside the rotary shaft with a cylindrical shape and a closed end inserted in the reaction vessel.

\* \* \* \* \*